US008310502B2

(12) United States Patent
Myers et al.

(10) Patent No.: US 8,310,502 B2
(45) Date of Patent: Nov. 13, 2012

(54) SYSTEM AND METHOD FOR ADJUSTING DISPLAY INPUT VALUES

(75) Inventors: Robert L. Myers, Loveland, CO (US); John W. Frederick, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 802 days.

(21) Appl. No.: 12/476,943

(22) Filed: Jun. 2, 2009

(65) Prior Publication Data

US 2010/0302273 A1 Dec. 2, 2010

(51) Int. Cl.

| | |
|---|---|
| ***G09G 5/00*** | (2006.01) |
| ***G09G 5/02*** | (2006.01) |
| ***H04N 5/46*** | (2006.01) |
| ***H04N 9/12*** | (2006.01) |
| ***G02F 1/13*** | (2006.01) |
| ***G06K 9/00*** | (2006.01) |
| ***G06K 9/40*** | (2006.01) |
| *G09G 5/36* | (2006.01) |
| *H04N 17/00* | (2006.01) |
| *H04N 11/00* | (2006.01) |
| *G03F 3/08* | (2006.01) |

(52) U.S. Cl. ........ 345/593; 345/549; 345/589; 345/619; 345/629; 348/179; 348/552; 348/557; 348/563; 358/519; 382/167; 382/254; 382/274; 349/1

(58) Field of Classification Search .................. 345/581, 345/589–591, 593, 600–604, 619, 629, 156, 345/204, 690, 88, 597, 630, 546–549; 348/177–179, 348/552–555, 557–558, 739, 751, 560, 563–567, 348/584, 589; 358/504, 519; 382/167, 254, 382/274, 276; 349/1, 19

See application file for complete search history.

(56) References Cited

U.S. PATENT DOCUMENTS

| | | | | |
|---|---|---|---|---|
| 5,680,327 | A * | 10/1997 | Cook et al. | 356/326 |
| 2001/0050679 | A1* | 12/2001 | Shigeta | 345/204 |
| 2004/0212610 | A1* | 10/2004 | Hamlin | 345/211 |
| 2007/0285436 | A1* | 12/2007 | Wu et al. | 345/604 |
| 2010/0149203 | A1* | 6/2010 | Mebane | 345/589 |

* cited by examiner

*Primary Examiner* — Wesner Sajous

(57) ABSTRACT

Systems and methods of providing user-selected color characteristics for an LCD device to a host system are disclosed. An exemplary method includes receiving user input at the LCD device, the user input specifying color information for each of a plurality of color presets selected by the user. The method also includes each time the user changes color information for each of the plurality of color presets selected by the user, merging the color information with static information for the LCD device. The method also includes communicating the merged color information and static information to the host system in a standardized format.

20 Claims, 9 Drawing Sheets

Fig. 6a

600

604

EDID Block 0, Bytes 0-127 [00H-7FH]
Block Type: EDID 1.3

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 00 | FF | FF | FF | FF | FF | FF | 00 | 22 | F0 | F3 | 26 | 01 | 01 | 01 | 01 |
| 10 | 08 | 12 | 01 | 03 | 80 | 34 | 20 | 78 | EA | EE | 91 | A3 | 54 | 4C | 99 | 26 |
| 20 | 0F | 50 | 54 | A5 | 08 | 00 | 81 | 40 | 81 | 80 | A9 | 00 | A9 | 40 | B3 | 00 |
| 30 | D1 | C0 | D1 | 00 | 01 | 01 | 28 | 3C | 80 | A0 | 70 | B0 | 23 | 40 | 30 | 20 |
| 40 | 36 | 00 | 06 | 44 | 21 | 00 | 00 | 1A | 00 | 00 | 00 | FD | 00 | 2F | 3D | 18 |
| 50 | 50 | 11 | 00 | 0A | 20 | 20 | 20 | 20 | 20 | 20 | 00 | 00 | 00 | FC | 00 | 48 |
| 60 | 50 | 20 | 4C | 50 | 32 | 34 | 38 | 30 | 7A | 78 | 0A | 20 | 00 | 00 | 00 | FF |
| 70 | 00 | 33 | 43 | 4D | 38 | 30 | 38 | 30 | 30 | 30 | 31 | 0A | 20 | 20 | 00 | D2 |

•
•
•

[To Fig. 6b]

[From Fig. 6a]

Fig. 6c

⋮

[From Fig. 6b]

600

604

(15H) Maximum Horizontal Image Size ______________ = 520 mm
(16H) Maximum Vertical Image Size ______________ = 320 mm
(17H) Display Gamma ______________ = 2.20
(18H) DPMS and Supported Feature(s):
Stand-By, Suspend, Active Off, Preferred Timing Mode
Display Type = R/G/B Color
(19H-22H) CHROMA INFO:
Red x - 0.640 Green x - 0.300 Blue x - 0.150 White x - 0.313
Red y - 0.330 Green y - 0.600 Blue y - 0.060 White y - 0.329
(23H) ESTABLISHED TIMING I:
720 x 400 @ 70Hz (IBM,VGA)
640 x 480 @ 60Hz (IBM,VGA)
640 x 480 @ 75Hz (VESA)
800 x 600 @ 60Hz (VESA)
(24H) ESTABLISHED TIMING II:
1024 x 768 @ 60Hz (VESA)
(25H) Manufacturer's Reserved Timing:
None Specified
(26H-35H) Standard Timing Identification:
Standard Timing ID 1: 1280 x 960 @60Hz
Standard Timing ID 2: 1280 x 1024 @60Hz
Standard Timing ID 3: 1600 x 1000 @60Hz
Standard Timing ID 4: 1600 x 1200 @60Hz
Standard Timing ID 5: 1680 x 1050 @60Hz
Standard Timing ID 6: 1920 x 1080 @60Hz
Standard Timing ID 7: 1920 x 1200 @60Hz
Standard Timing ID 8 - Not Used

⋮

[To Fig. 6d]

Fig. 6d

⋮

[From Fig. 6c]

600

604

(36H-47H) Detailed Timing / Descriptor Block 1:
1920x1200 Pixel Clock: 154.00 MHz
Horizontal Image Size: 518 mm Vertical Image Size: 324 mm
Refreshed Mode: Non-Interlaced Normal Display - No Stereo
Horizontal:
Active Count: 1920 pixels Blanking Count: 160 pixels
Sync Offset: 48 pixels Sync Pulse Width: 32 pixels
Border: 0 pixels Frequency: 74.04 kHz
Vertical:
Active Count: 1200 lines Blanking Count: 35 lines
Sync Offset: 3 lines Sync Pulse Width: 6 lines
Border: 0 lines Frequency: 59.95 Hz
Digital Separate, Horizontal Polarity (+) Vertical Polarity (-)

(48H-59H) Detailed Timing / Descriptor Block 2:
Monitor Range Limits:
Min Vertical Freq - 47 Hz
Max Vertical Freq - 61 Hz
Min Horiz. Freq - 24 kHz
Max Horiz. Freq - 80 kHz
Pixel Clock - 170 MHz
GTF - Not Used (5AH-6BH) Detailed Timing / Descriptor Block 3:
Monitor Name:
HP LP2480zx (6CH-7DH) Detailed Timing / Descriptor Block 4:
Monitor Serial Number:
3CM8080001
(7EH) Block No: No Extension EDID Block(s)
(7FH) CheckSum OK

SYSTEM AND METHOD FOR ADJUSTING DISPLAY INPUT VALUES

BACKGROUND

Liquid crystal display (LCD) display devices are widely used in desktop and other computing environments. An LCD display device (or "LCD device") includes a liquid crystal panel, a backlight, and associated drive electronics. An LCD device can include an LCD module and associated front end electronics that may include video inputs, peripheral inputs (e.g. USB), scaler, processor, power supply electronics, etc. Color critical LCD devices are widely used in professional photography, video and/or graphics environments, or other environments in which color critical displays may be desired. Color critical LCD devices can be designed to conform to a particular standardized color space or output device specification.

Color management systems in the video source (e.g., a PC or workstation) typically rely on certain identification data provided by the LCD device in order to configure correctly and to provide the proper transform of the image data based on the particular standardized color space or output device specification. However, if the LCD device characteristics cannot be identified by the source, or if the data provided by the LCD device does not match current characteristics, the color management system may not recognize that the LCD device is performing per the intended standard and that no further color management is needed.

If this should occur, the color management system may process the image data in such a way that the resulting image on the display is actually be less accurate than would otherwise be the case. Therefore, it is desirable that the display correctly identifies itself and properly describes the current color characteristics to produce an accurate image.

DETAILED DESCRIPTION OF THE DRAWINGS

In color critical LCD devices (e.g., the LP2480zx LCD monitor, commercially available from Hewlett-Packard Company, Palo Alto, Calif.), the LCD device can change performance in terms of color gamut, tone response (or gamma curve), white point, and brightness through by a user selecting one of a number of color space presets. The color information within each preset may also be selected and changed by the user, e.g., using the on-screen display (OSD) controls and a separate calibration tool (e.g., a colorimeter and associated software, used to characterize the display's color performance and then program the color presets as desired).

In this manner, the LCD device may be configured such that the performance matches desired output characteristics. Output characteristics may include, but are not limited to various standard specifications such as, sRGB, AdobeRGB, etc. This ability makes color management by the video source unnecessary, as source images encoded per a given standard may be sent unprocessed to the display, where these images are correctly displayed on the LCD device.

Figure 1:
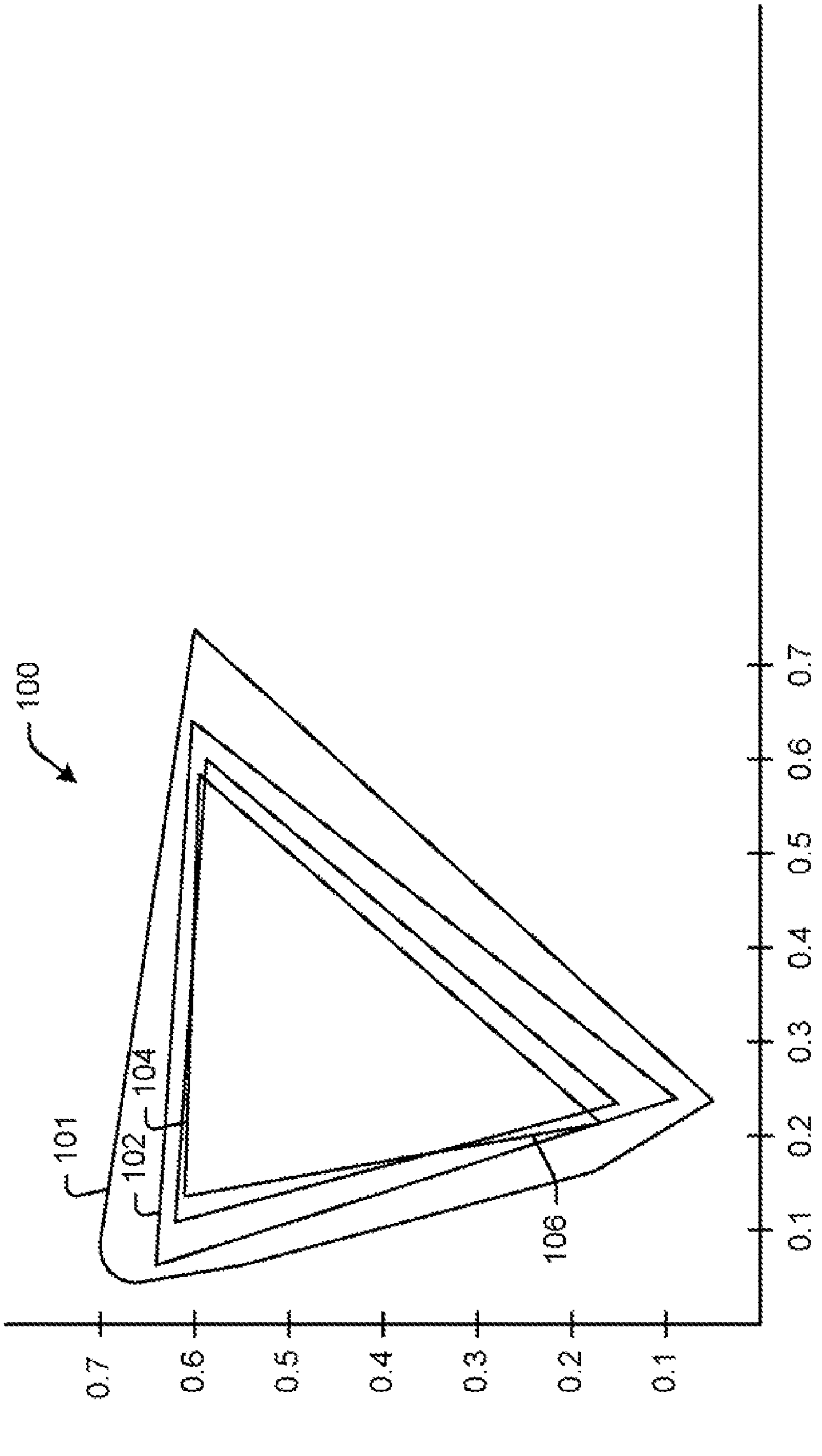
FIG. 1 shows a chromaticity chart depicting the 1976 CIE u'v' color space and various standard output device specification color gamuts.

FIG. 1 depicts an exemplary chromaticity chart 100 on which various color gamuts are plotted. As one example, the 1976 CIE u'v' color space 101 is depicted by the chromaticity chart 100, which depicts a mapping of human color perception in terms of two CIE parameters u' and v'. Also shown within the chromaticity chart 100 are color gamuts of various color spaces defined by various standard output device specification are depicted within the 1978 CIE u'v' color space.

For example, the Adobe® RGB color space is defined by the first triangle 102. In other words, the first triangle 102 defines the color gamut of a LCD device conforming to the Adobe® RGB output device specification within the depicted 1976 CIE u'v' color space. The second triangle 104 can define defines a sRGB/Rec. 709 output device specification. The third triangle 106 can define a SMPTE-C output device specification. Other output device specifications can also be plotted without the 1976 CIE u'v' color space depicted in the chromaticity chart 100 as can be appreciated. It should also be appreciated that the depicted color gamuts on the chromaticity chart 100 are not necessarily to scale, and are shown to illustrate that various output device specifications have varying color gamuts within the 1976 u'v' CIE color space 101.

These standard output device specifications represent an expected response by a display that is designed to comply with such a specification. In other words, for a given input value for a particular pixel on such a display, any display conforming to a particular standard output device specification is expected to emit substantially the same luminance at substantially the same perceived color. Stated another way, any display conforming to the particular standard output device specification is expected to have substantially the same transfer function or gamma response curve. In addition, these specifications also specify RGB primaries, white point, and white luminance with which a conforming display must comply. The RGB primary requirements of a standard output device specification specify the nominal chromaticity coordinates and/or tristimulus values of the red, green, and/or blue primary colors produced by that device at the maximum red, green, and/or blue input value. Likewise, a white point specified by a standard output device specification define tristimulus values and/or chromaticity coordinates that serve to define a target white or reference white of a conforming display.

Figure 2:
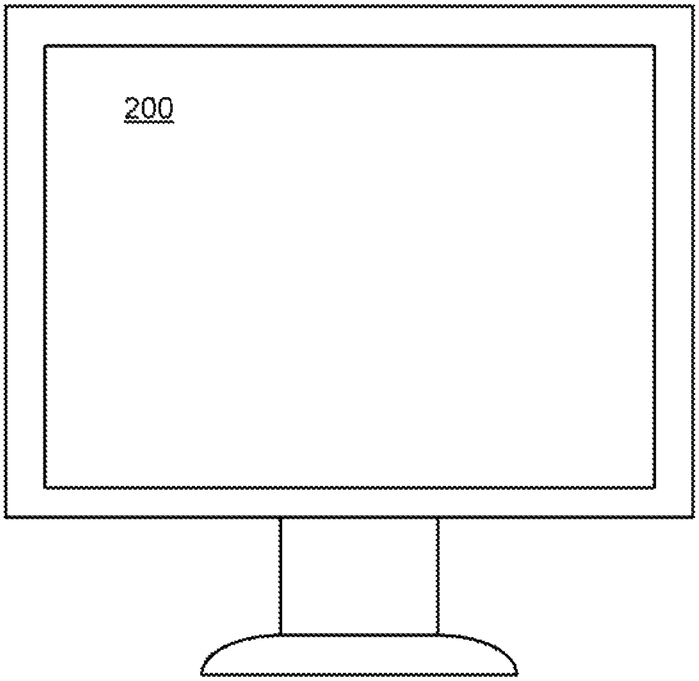
FIG. 2 shows an exemplary LCD device.

FIG. 2 depicts an exemplary color critical liquid crystal display (LCD) device 200. The LCD device 200 is configured with the capability to comply with a variety of standardized output device specifications. In one embodiment, the LCD device 200 is configured with a 10-bit LCD panel and a light emitting diode (LED) backlight incorporating red, green and blue LEDs, and has a native color gamut that is wider or offers a more dynamic range than many standardized output device specifications employed in color critical settings. In one embodiment, the LCD panel includes at least three addressable subpixels corresponding to a pixel of the display, each of which can be assigned a 10-bit value. Each of the subpixels can correspond to an individual red, green, or blue subpixel, respectively. Accordingly, because a 10-bit LCD panel can be employed, each subpixel can produce $2^{10}$ levels of intensity. Because (in the above non-limiting example) each pixel corresponds to the three red, green, and blue subpixels, $(2^{10})^3$ discrete colors can be reproduced from each pixel on the display. It should be appreciated that embodiments according to the disclosure can employ LCD panels supporting various bit depths, and that the above example is non-limiting.

In addition, an LED backlight is employed, as opposed to a cold cathode fluorescent lamp (CCFL) backlight, which permits white point control via the backlight without adjusting red, green, and/or blue maximum levels of the subpixels of the panel itself. In other words, because the red, green, and blue channels of the backlight can be independently controlled, a whitepoint can be chosen and/or varied according to various standard output device specifications without compensating the maximum subpixel values assignable for red, green, and blue subpixels, which can often be a compromise employed in a display employing a CCFL backlight.

Figure 3:
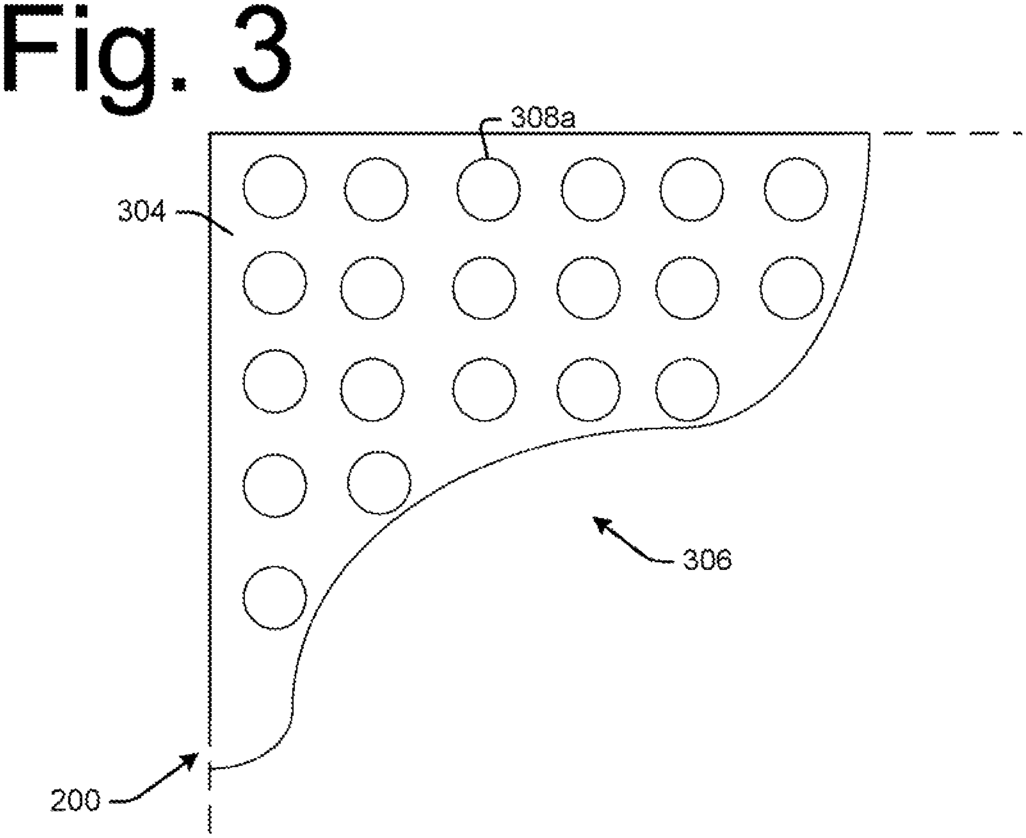
FIG. 3 is a cutaway view of the LCD device shown in FIG. 2.

FIG. 3 depicts a cutaway view of the LCD device 200. FIG. 3 illustrates an RGB LED backlight 304 employed according to embodiments of the disclosure. In one embodiment, the RGB LED backlight 304 can be configured as an array of LED clusters 308 that can independently emit red, green, and blue light and/or combinations thereof. The LED clusters 308 of the RGB LED backlight 403 can emit light from behind the LCD panel 302, and the backlight employed to improve visibility of pixels in the LCD panel 306, particularly low light conditions. In addition, because the RGB LED backlight 304 includes a plurality of LED clusters 308 having the capability to emit red, green, and blue light, the levels of red, green, and blue light emitted by each of the LED clusters can be varied in order to produce various luminance and/or whitepoint settings according to the desires of a user or to comply with one or more standard output device specifications.

It should be appreciated that various standard output device specifications can define varying color gamuts, each having a varying definition of a whitepoint. Accordingly, as noted above, the RGB LED backlight 304 permits an adjustable whitepoint depending on a standard output device specification chosen, which can be employed without adjusting the maximum subpixel values assignable for red, green, and blue subpixels of the LCD panel 306 in order to compensate for a non-white output of an alternative backlight.

Figure 4:
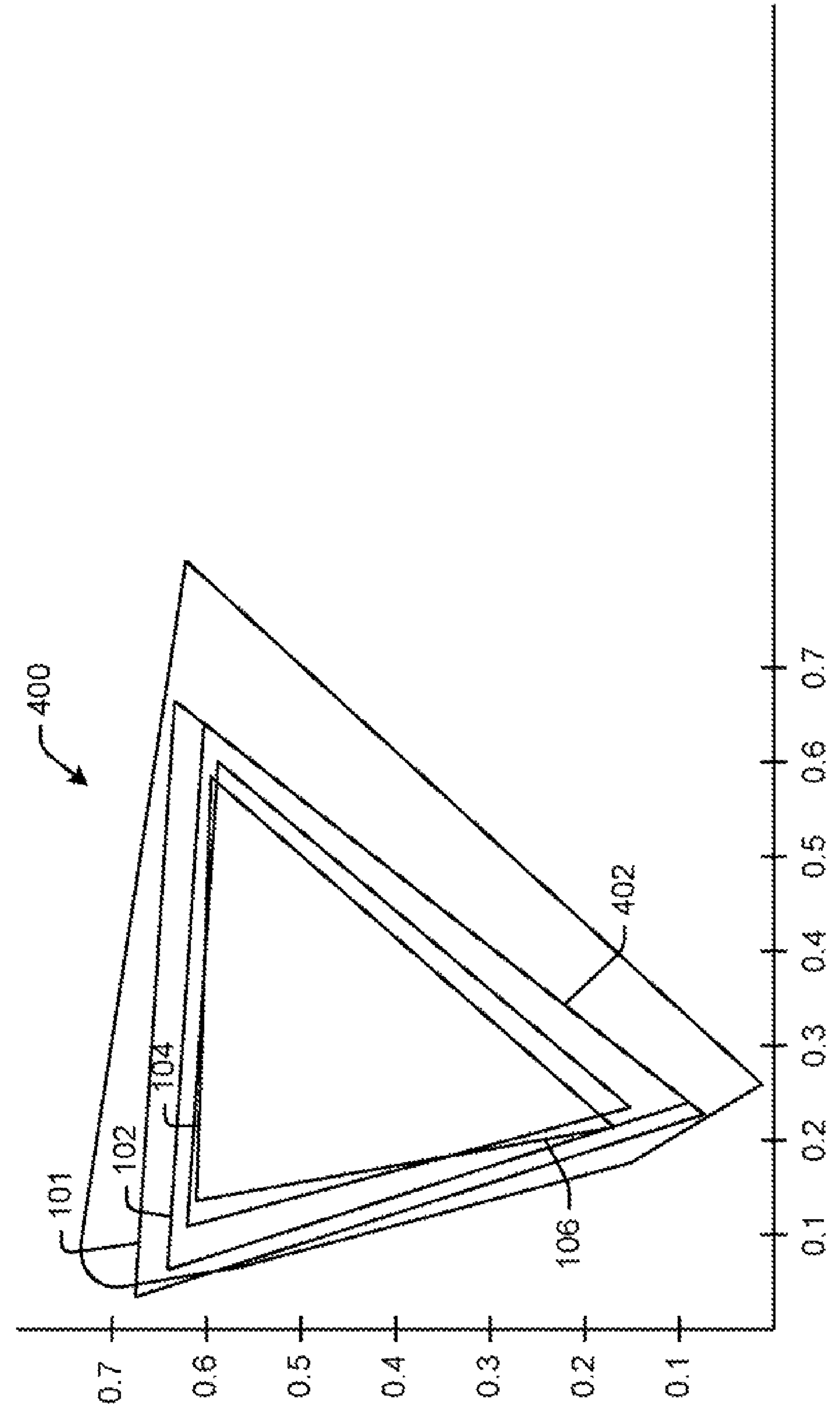
FIG. 4 shows a chromaticity chart depicting the 1976 CIE u'v' color space, various standard output device specification color gamuts, and a color gamut of the LCD panel of the LCD.

FIG. 4 depicts the exemplary chromaticity chart 100 of FIG. 1 on which various color gamuts are plotted. As noted above, the 1976 CIE u'v' color space 101 is depicted by the chromaticity chart 100, which depicts a mapping of human color perception in terms of two CIE parameters u' and v'. Also shown within the chromaticity chart 100 are color gamuts of various color spaces defined by various standard output device specification are depicted within the 1978 CIE u'v' color space 101. Accordingly, FIG. 4 depicts a triangle 402 corresponding to a color gamut of an LCD panel 306 employed in an embodiment of the disclosure. The color gamut represented by the triangle 402 "encloses" the color gamuts represented by the various exemplary standard output device specifications 102, 104, 106. In other words, the LCD panel 306 displays a wider range of colors. Therefore, input values provided to an LCD device according to an embodiment of the disclosure can be adjusted in order to facilitate compliance with standard output device specifications, as is discussed hereinbelow.

Figure 5:
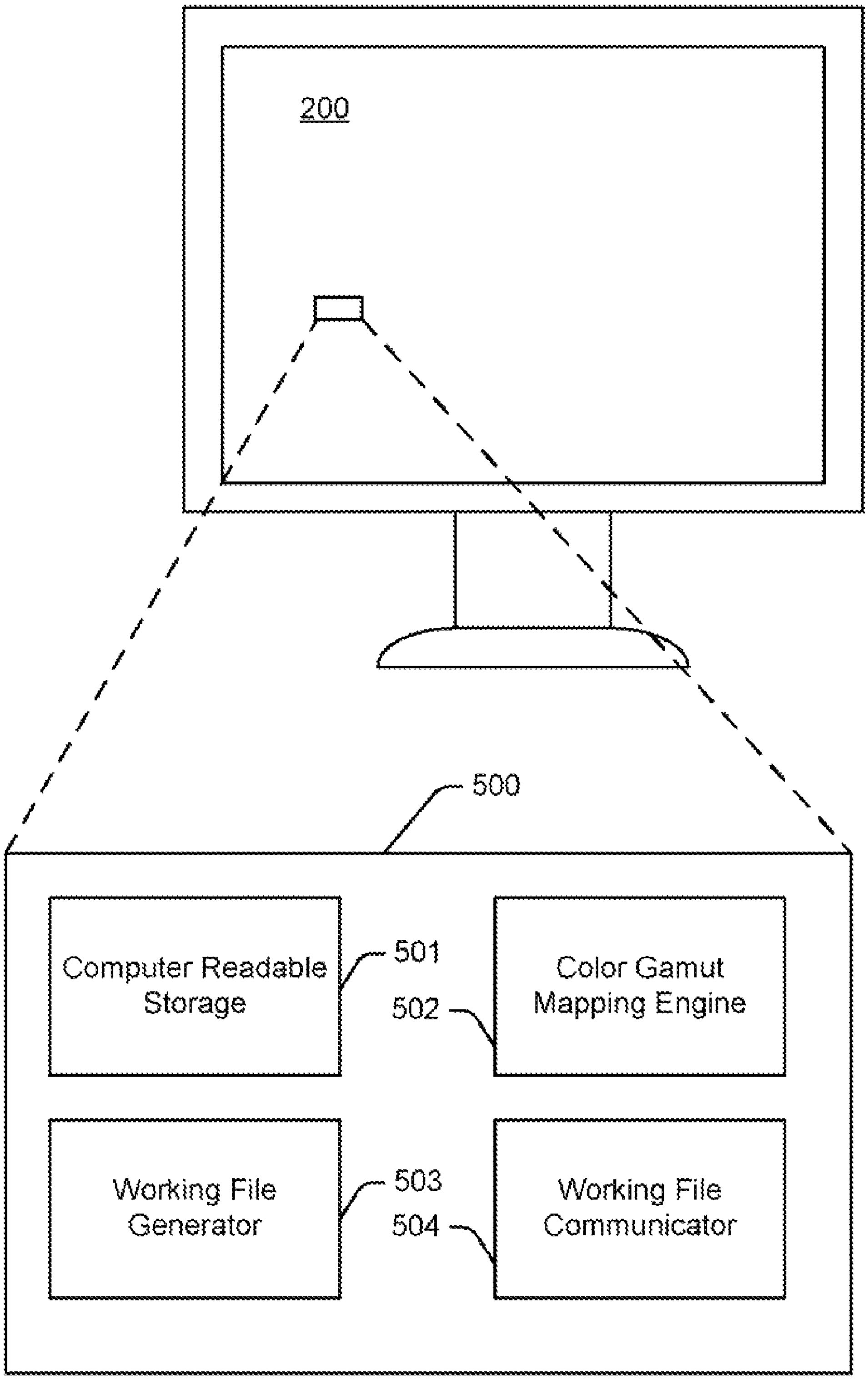
FIG. 5 shows an LCD device and color gamut mapping engine according to an embodiment of the disclosure.

FIG. 5 is an alternative depiction of the LCD device 200 according to an embodiment of the disclosure. The LCD device 200 includes program code 500 (e.g., firmware) stored on computer readable media 501. The program code may include a color gamut mapping engine 502 that permits the LCD device 200 to comply with a variety of standard output device specifications. The color gamut mapping engine 502 can be included in associated front end electronics of an LCD device. The color gamut mapping engine 502 permits the above flexibility by adapting input values from a computer graphics system to adapt to a standard output device specification. In addition, the light emanated by the RGB LED backlight can also be adjusted to vary properties such as whitepoint and luminance. To implement the above mentioned functionality, the color gamut mapping engine 502 adjusts input values received by the monitor based upon the native color gamut of the LCD device 200, which can be determined upon the manufacture of the LCD device 200 taking into account the response characteristics of the LCD panel and the RGB LED backlight in response to various inputs.

Because the native color gamut of the LCD panel "encloses" various gamuts corresponding to standard output device specifications used in the art, the adjusted input values can be generated by the color gamut mapping engine 502 cause the LCD device 200 to emulate a standard output device specification. In other words, as noted with respect to the discussion regarding FIG. 1, because the LCD panel can display a broader range of colors relative to the color gamut of various standard output device specifications, the input values can be adjusted by the color gamut mapping engine 502 to emulate the gamma response curve and other properties (e.g., RGB primaries, white point, luminance) that are associated with a particular standard output device specification. Additionally, in some embodiments, the light emanated by the RGB LED backlight can be varied in order to modify the white point and/or luminance of the LCD device to comply with a particular standard output device specification.

The color gamut mapping engine 502 can also allow a user to select from among various standard output device specifications that can be preprogrammed in the color gamut mapping engine 502. In one embodiment, the color gamut mapping engine 502 or other memory accessible to the LCD device 200 can be configured to store the various color space properties of various standard output device specifications, including, but not limited to, sRGB, SMPTE-C, Adobe® RGB, and SMPTE-431-2. In another embodiment, the color gamut mapping engine 502 or other memory can be configured to store settings that direct how input values and/or the RGB LED backlight should be adjusted in order to compensate for the native properties of the LCD panel such that the LCD device 200 complies with various standard output device specifications.

Accordingly, a user may select a standard output device specification that the user wishes the LCD device 200 to emulate. Additionally, the user may switch between various specifications that the LCD device 200 can emulate, which provides the ability for a user to view content in various output device specifications on a single LCD device 200 without having to recalibrate the monitor for each specification. The color gamut mapping engine 502 can be configurable in this way by commands sent via an input/output interface to the LCD device 200. An input/output interface can include, but is not limited to, a Universal Serial Bus (USB) interface, Ethernet interface, a Data Display Channel/Command Interface (DDC/CI), and other input/output interfaces as can be appreciated.

Additionally, a user may also configure the color gamut mapping engine and/or the RGB LED backlight via the input/output interface to achieve various settings for RGB primaries, whitepoint, gamma, luminance, and other monitor properties that may vary from standard output device specifications for which LCD device 200 is preprogrammed. Accordingly, a user interface to facilitate such functionality can be provided on a personal computer via color calibration software or within the LCD device 200 itself via an on screen display (OSD). These user defined settings can be stored within the color gamut mapping engine 502 or other memory accessible to the LCD device 2001. In this way, a user to create, calibrate, and store these various monitor settings and switch between user defined settings and/or standard output device specifications without a complete recalibration of the monitor.

The LCD device may implement the program code 500 to change performance by the user selecting one of a number of color presets defining color gamut, tone response (or gamma curve), white point, and brightness. The color information within each preset may also be selected and changed by the user, e.g., using the on-screen display (OSD) controls and a separate calibration tool (e.g., a colorimeter and associated software, used to characterize the display's color performance and then program the color presets as desired).

Because the color information may be changed at the LCD device, the updated color information needs to be provided to the host system. In an exemplary embodiment, identification data may be communicated to the host system in a standardized format. One such format is as Extended Display Identification Data (or EDID) file. The EDID format is an industry standard established by the Video Electronics Standards Association (VESA). However, the LCD device is not limited to any particular file format. By way of example, VESA has published a standard currently known as "DisplayID." DisplayID is similar in structure and function to the EDID format. For purposes of this discussion, however, the EDID format will be used for purposes of illustration.

Typically, the EDID data is fixed at the time of the manufacture for a conventional monitor, and therefore can be stored in nonvolatile memory (e.g., an EPROM) at the monitor and provided to the host system, e.g., at startup. However, in exemplary implementations of the LCD device, the EDID contents may be modified dynamically or "on the fly" as different color presets are selected by the user.

In an exemplary embodiment, EDID data may be provided to the host system as follows. All EDID information which is "generic" to all presets (or static) is stored within the monitor storage 501 (e.g., programmed at the factory). Static information may include, for example, the model number, serial number, supported timings, date of manufacture, etc.

In addition, information specific to each color preset (such as primary chromaticities, "gamma" value, white point, etc.) is stored separately for each preset. A working file generator 503 may produce a working file by merging the static information with the preset-specific (or user-selected) data.

FIG. 6 shows an exemplary working file 600 which may be generated for providing user-selected color characteristics for an LCD device to a host system. Working file 600 is shown including static information 602 and 604 which is "generic" to all presets, and information specific to each color preset 601 and 603. The working file can then be updated whenever the user makes changes to the color information, and the current working file may be provided by the working file communicator 504 to the host system whenever a read is requested by the LCD device.

In alternative embodiment, complete preset-specific information files may be generated and stored on the LCD device instead of dynamically generating the working file. These preset-specific information files may then be "swapped in" when each preset is selected by the user.

Figure 7:
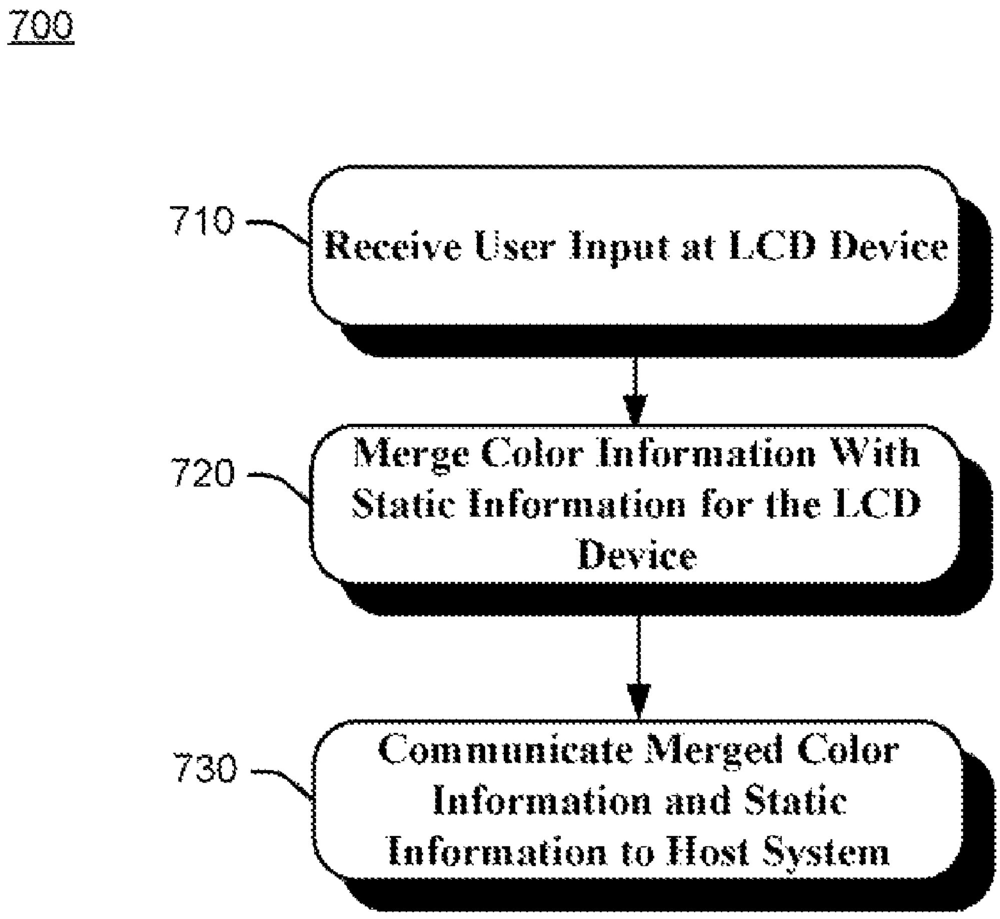
FIG. 7 is a flowchart illustrating exemplary operations which may be implemented for providing user-selected color characteristics for an LCD device to a host system.

FIG. 7 is a flowchart illustrating exemplary operations which may be implemented for providing user-selected color characteristics for an LCD device to a host system. Operations 700 may be embodied as logic instructions on one or more computer-readable medium. When executed on a processor, the logic instructions cause a general purpose computing device to be programmed as a special-purpose machine that implements the described operations. In an exemplary implementation, the components and connections depicted in the figures may be used for providing user-selected color characteristics for an LCD device to a host system.

In operation 701, user input is received at the LCD device, e.g., via the OSD. The user input specifies color information (e.g., primary chromaticities, gamma value, and white point) for each of a plurality of color presets (e.g., sRGB, Adobe RGB, SMPTE-C, and SMPTE-431-2) selected by the user. In operation 702, the color information is merged with static information for the LCD device (e.g., model number, serial number, supported timings, and date of manufacture). Merging may occur each time the user changes color information for each of the plurality of color presets selected by the user. In operation 703, the merged color information and static information is communicated to the host system in a standardized format (e.g., EDID or DisplayID).

The operations shown and described herein are provided to illustrate exemplary implementations of providing user-selected color characteristics for an LCD device to a host system. It is noted that the operations are not limited to the ordering shown. Still other operations may also be implemented.

It is noted that the exemplary embodiments shown and described are provided for purposes of illustration and are not intended to be limiting. Still other embodiments are also contemplated for providing user-selected color characteristics for an LCD device to a host system.

The invention claimed is:

1. A method of providing user-selected color characteristics for an LCD device to a host system, comprising:

receiving user input at the LCD device, the user input specifying color information for each of a plurality of color presets selected by the user;

each time the user changes color information for each of the plurality of color presets selected by the user, merging the color information with static information for the LCD device; and communicating the merged color information and static information to the host system in a standardized format.

2. The method of claim 1, wherein the color presets is at least one of: sRGB, Adobe RGB, SMPTE-C, and SMPTE-431-2.

3. The method of claim 1, wherein the color information further comprise a plurality of codes corresponding to a value of red, blue, and green levels for a pixel of the LCD device.

4. The method of claim 1, wherein the static information includes at least model number, serial number, supported timings, and date of manufacture.

5. The method of claim 1, wherein the color information includes at least primary chromaticities, gamma value, and white point.

6. The method of claim 1, wherein the color information is stored separately at the LCD device for each of the plurality of color presets.

7. The method of claim 1, wherein the color information is displayed via the OSD at the LCD device for each of the plurality of color presets.

8. The method of claim 1, wherein the standardized format is Display ID.

9. The method of claim 1, wherein the standardized format is EDID.

10. A non-transitory computer readable media comprising instruction that is executed in an LCD device for providing user-selected color characteristics to a host computing system, the instructions to:

receive user input at the LCD device, the user input specifying color information for each of a plurality of color presets selected by the user;

update a working file with both the color information based on the user input and static information; and provide the updated working file to the host system in a standardized format each time the user selects different color information.

11. The computer readable media of claim 10, wherein the static information includes at least model number, serial number, supported timings, and date of manufacture.

12. The computer readable media of claim 10, wherein the color information includes at least primary chromaticities, gamma value, and white point.

13. The computer readable media of claim 10, wherein the color information is stored separately at the LCD device for each of the plurality of color presets.

14. The computer readable media of claim 10, wherein the color information is displayed via the OSD at the LCD device for each of the plurality of color presets.

15. The computer readable media of claim 10, wherein the standardized format is EDID or Display ID.

16. An LCD device comprising:

computer readable storage configured to store static information for the LCD device;

an OSD for receiving user input specifying color information for each of a plurality of color presets selectable by the user;

program code executable at the LCD device for generating a working file with both the color information based on the user input and static information; and program code executable at the LCD device for providing the working file to the host system in a standardized format each time the user selects different color information for updating the host system with user-selected color characteristics.

17. The LCD device of claim 16, wherein the static information includes at least model number, serial number, supported timings, and date of manufacture.

18. The LCD device of claim 16, wherein the color information includes at least primary chromaticities, gamma value, and white point.

19. The LCD device of claim 16, wherein the color information is stored separately at the LCD device for each of the plurality of color presets.

20. The LCD device of claim 16, wherein the color information is displayed via the OSD at the LCD device for each of the plurality of color presets.

* * * * *

UNITED STATES PATENT AND TRADEMARK OFFICE

CERTIFICATE OF CORRECTION

PATENT NO. : 8,310,502 B2
APPLICATION NO. : 12/476943
DATED : November 13, 2012
INVENTOR(S) : Robert L. Myers et al.

It is certified that error appears in the above-identified patent and that said Letters Patent is hereby corrected as shown below:

In the Specification

Figure 6B:
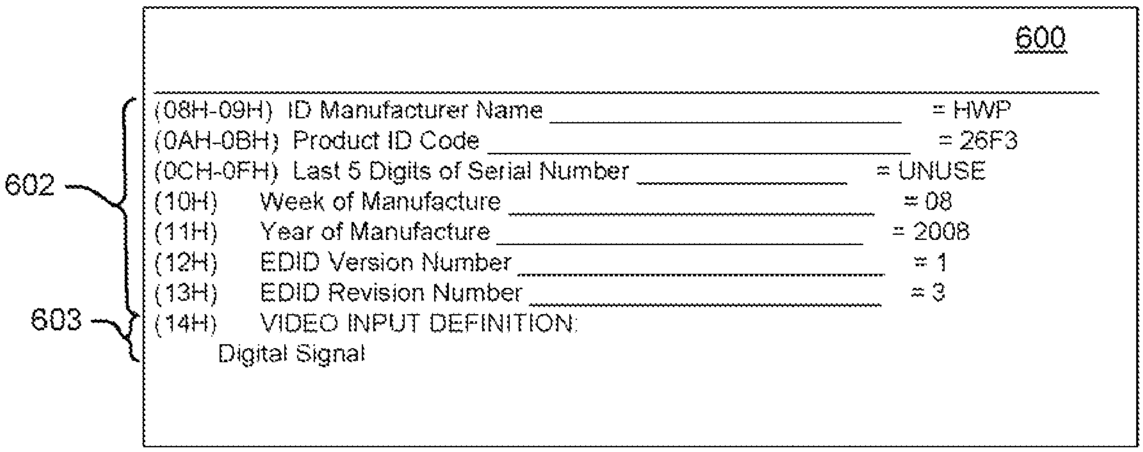
FIG. 6 shows an exemplary working file which may be generated for providing user-selected color characteristics for an LCD device to a host system.

In column 1, line 50, delete “FIG. 6” and insert -- FIGS. 6a-d --, therefor.

In column 5, line 53, delete “FIG. 6” and insert -- FIGS. 6a-d --, therefor.

Signed and Sealed this
Second Day of July, 2013

Teresa Stanek Rea
*Acting Director of the United States Patent and Trademark Office*